(12) United States Patent
Farkas et al.

(10) Patent No.: US 12,302,496 B2
(45) Date of Patent: May 13, 2025

(54) SYSTEM AND METHOD TO ELIMINATE VIA STRIPING

(71) Applicant: DELL PRODUCTS L.P., Round Rock, TX (US)

(72) Inventors: Sandor Farkas, Round Rock, TX (US); Bhyrav Mutnury, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 303 days.

(21) Appl. No.: 17/901,093

(22) Filed: Sep. 1, 2022

(65) Prior Publication Data
US 2024/0080978 A1    Mar. 7, 2024

(51) Int. Cl.
*H05K 1/11*    (2006.01)
*H05K 3/00*    (2006.01)
*H05K 3/40*    (2006.01)

(52) U.S. Cl.
CPC .......... *H05K 1/115* (2013.01); *H05K 3/0047* (2013.01); *H05K 3/4038* (2013.01); *H05K 2201/09563* (2013.01); *H05K 2203/0207* (2013.01)

(58) Field of Classification Search
CPC ............... H05K 1/115; H05K 3/0047; H05K 2201/09563; H05K 2203/0207; H05K 3/4038
See application file for complete search history.

(56) References Cited

U.S. PATENT DOCUMENTS

| | | | |
|---|---|---|---|
| 9,433,084 B2 | 8/2016 | Lau | |
| 10,182,494 B1* | 1/2019 | Jacobbson | H05K 3/445 |
| 10,842,017 B2 | 11/2020 | Chandra et al. | |
| 2015/0047892 A1* | 2/2015 | Yang | H05K 3/0047 |
| | | | 174/262 |

* cited by examiner

*Primary Examiner* — James Wu
(74) *Attorney, Agent, or Firm* — Larson Newman, LLP

(57) ABSTRACT

A printed circuit board includes metal layers, a metalized circuit via interconnecting a first one of the metal layers and a second one of the metal layers, and a back-drill hole drilled to remove metalization of the circuit via from a third metal layer adjacent to the second metal layer to a fourth metal layer at a first surface of the printed circuit board. The back-drill hole has a profile that includes a first undercut at a bottom of the first back-drill hole.

18 Claims, 5 Drawing Sheets

SYSTEM AND METHOD TO ELIMINATE VIA STRIPING

FIELD OF THE DISCLOSURE

This disclosure generally relates to information handling systems, and more particularly relates to eliminating via striping in a printed circuit board.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A printed circuit board may include metal layers, a metalized circuit via interconnecting a first one of the metal layers and a second one of the metal layers, and a back-drill hole drilled to remove metalization of the circuit via from a third metal layer adjacent to the second metal layer to a fourth metal layer at a first surface of the printed circuit board. The back-drill hole may have a profile that includes a first undercut at a bottom of the first back-drill hole.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1A:
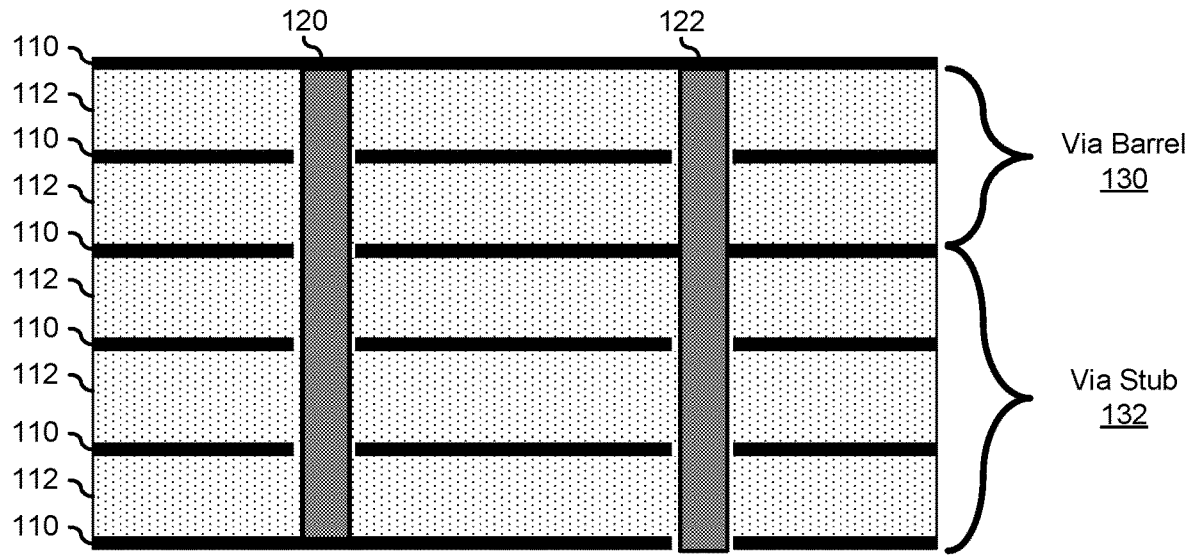
FIGS. 1A and 1B illustrate a printed circuit board (PCB) with various circuit vias.

FIG. 1A illustrates a printed circuit board (PCB) 100. PCB 100 includes metal layers 110 (illustrated as dark layers) separated by insulating layers 112 (illustrated as light shaded layers). Metal layers 110 represent any combination of power layers, ground layers, and signal layers, and are fabricated using any suitable type of metal, such as copper, aluminum, silver, gold, zinc, and nickel. Insulating layers 112 are fabricated using any suitable insulating material, such as pre-impregnated (prepreg) fiber materials like FR-4, Duroid, or the like. Metal layers 110 are interconnected by circuit vias, including vias 120 and 122. Vias 120 and 122 represent holes drilled into PCB 100, and then plated to provide electrical contacts between the vias and selected metal layers, as needed or desired. Vias 120 and 122 may have an exemplary diameter of 12-15 mils. Vias 120 and 122 may represent any combination of power/ground vias, signal ground vias, and signal vias.

For example, via 122 may represent a circuit trace configured to carry a high-speed data signal, and via 120 may represent an associated signal ground via configured to provide an electrical return path for the high-speed data signal. In this regard, the high-speed data signal may be a single-ended signal or may be a differential signal, as needed or desired. Where the high-speed data signal is a differential signal, via 122 will be understood to represent one of two circuit traces associated with the differential signal, where the other circuit trace is not illustrated. More generally, vias 120 and 122 may represent any combination of blind vias to connect a metal layer 110 on the surface of PCB 100 to a metal layer 110 within the PCB, buried vias to connect two interior metal layers 110, and through vias to connect two exterior metal layers.

PCB 100 represents a bare metal PCB, such that the PCB does not include any through-hole or surface-mount components added to a surface of the PCB. Via 120 connects a metal layer 110 on the top surface of PCB 100 to a metal layer 110 on the bottom surface of the PCB. In particular, via 120 is not connected to any of the interior metal layers 110, as illustrated by keep-out regions between the via and each of the interior metal layers. Via 122 connects the metal layer 110 on the top surface of PCB 100 with an interior metal layer 110 located two layers within the PCB. In particular, via 122 is not connected to the interior metal layer 110 located one layer within PCB 100, as illustrated by the keep-out region between the via and the first interior metal layer. The fabrication of via 122 includes a portion between the top metal layer 110 and the second interior metal layer 110 that provides the active signal carrying region of the via. The active signal carrying region is referred to as via barrel 130. The fabrication of via 122 further includes a portion below the second metal layer 110 that is not connected to any other metal layer. This portion is referred to as via stub 132. As the speed of high-speed data signals increase, via stub 132 introduces an increasing parasitic effect that adversely impacts the signal integrity of the high-speed data signal.

Figure 1B:
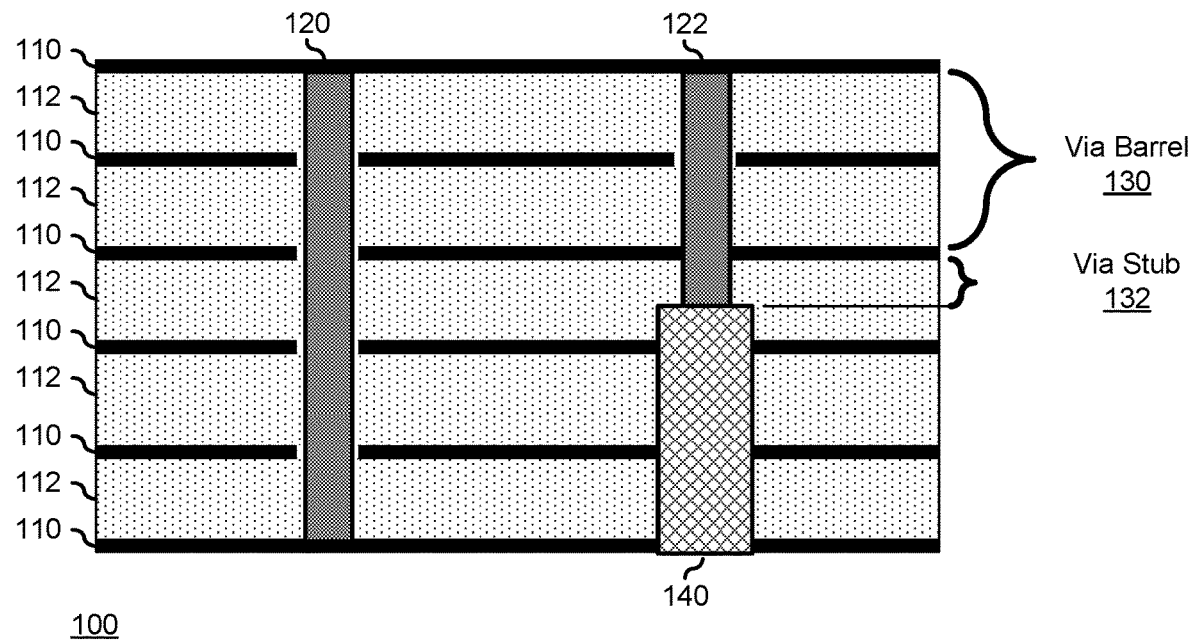

As fabricated via stub 132 extends from the second metal layer 110 through to the bottom metal layer 110, creating an open circuit stub that adversely affects the signal integrity of the high-speed data signal carried on via 122. As such, FIG. 1B illustrates where PCB 100 is fabricated utilizing a back drill process wherein via 122 is redrilled to a greater diameter than the via in order to remove the unwanted metal plating of the via, and to reduce the length of via stub 132. Via stub 132 is reduced to a desired length by a back-drill hole 140. For example, back-drill hole 140 may reduce the length of via stub 132 to less than ten (10) mils. Back drill hole 140 typically has a diameter that is slightly greater than the diameter of the via being back drilled. For example, where via 122 has a 10 mil diameter, back-drill hole 140 may have a 16 mil diameter.

Figure 2A:
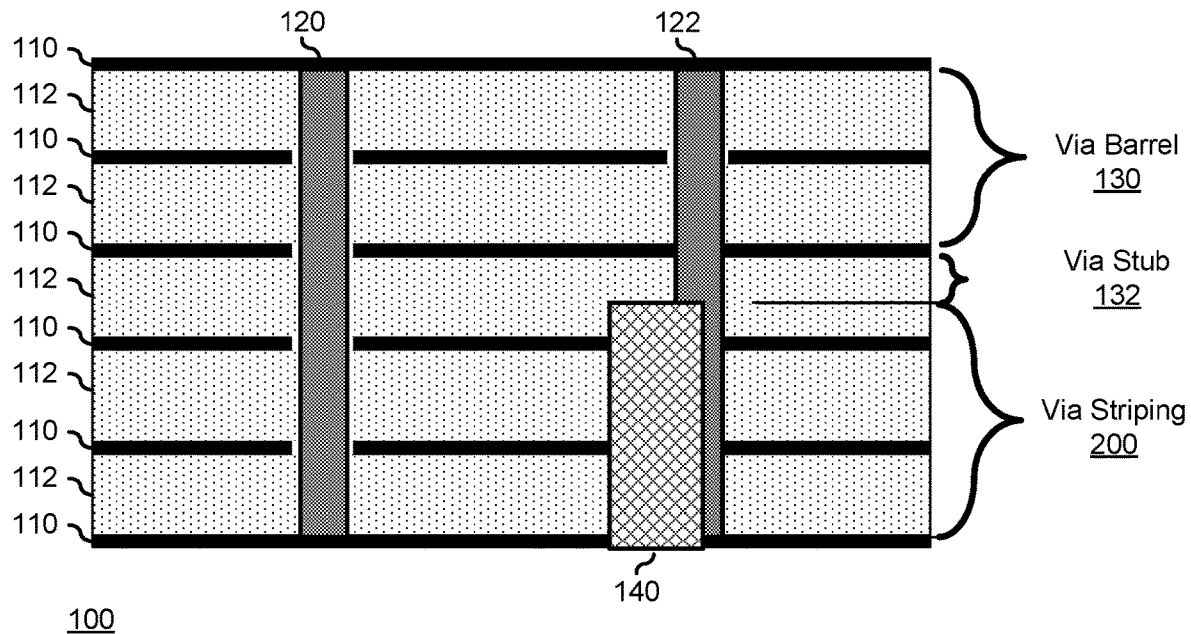
FIGS. 2A and 2B are diagrams of the PCB of FIG. 1 with various misaligned back-drilled vias.
Figure 2B:
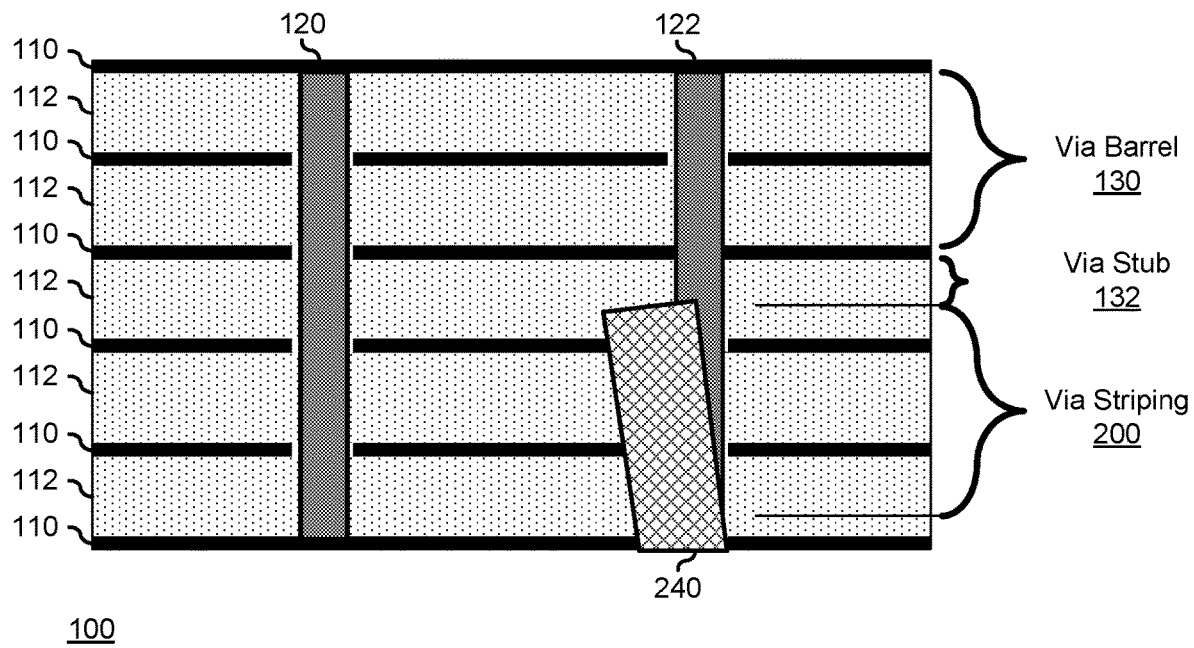

FIG. 2A illustrates PCB 100, but where, during the back drill process, the drill bit was misaligned, producing back-drill hole 240. In this case, the drilling of back-drill hole 240 failed to remove all of the excess plating, leaving a length of the metal plating that extends beyond via stub 132. Such excess plating is referred to as via striping 200. Via striping 200 electrically represents an extension to via stub 132, and contributes to poor signal integrity of the high-speed data signal carried on via 122. Here, in the back drill process, misaligned drilling occurs due to mis-centering of the drill bit with respect to a center of the via. In FIG. 2B, the misaligned drilling occurs due to mis-registration of the drill bit with respect to a perpendicular angle from the surface of PCB 100. In a particular case, the presence of via striping 200 may be reduced by utilizing a larger drill bit for the back drill process. However, the use of larger drill bits may be limited by the via-to-via spacing requirements for the PCB, the size of keep-out regions, or other factors that prevent the use of larger drill bits in the back drill process.

Figure 3:
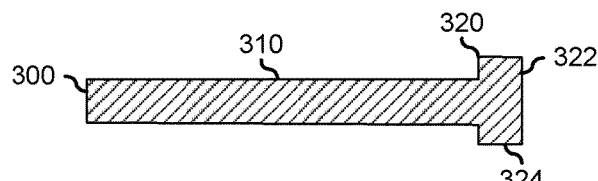
FIG. 3 is an illustration of an undercut back-drill bit according to an embodiment of the current disclosure.

FIG. 3 illustrates an undercut back-drill bit 300. Bit 300 is utilized in forming back-drill holes similar to back-drill holes 140 and 240, in a process to eliminate via striping, as described below with regard to FIGS. 4 and 5. Bit 300 includes a shank region 310, and a milling head 320. Shank region 310 has a diameter that is less than the diameter of the back-drill holes that are drilled with bit 300. For example, where a 10 mil via is provided, a back-drill hole may be intended to have a 16 mil diameter, and shank region 310 may have a diameter of 12 mil. Shank region 310 may be fluted, as needed or desired, to carry away the tailings from the drilling process. Milling head 320 includes a drilling surface 322 and an undercut milling surface 324. Drilling surface 322 is fabricated with one or more drilling chisel edges to cut vertically into PCBs to pilot the back-drill hole. In this regard, undercut milling surface 324 may be fluted to remove the tailings from the drilling process to shank region 310 for removal from the back-drill hole. Undercut milling surface 324 is configured with one or more chiseled flutes that cut into PCBs horizontally to form an undercut profile of the back-drilled hole, as described below. The profile of bit 300, as illustrated, is highly stylized, and the actual profile of a bit for combined drilling and undercutting may vary widely based upon PCB insulating materials, metal layer materials, via metalization materials and thickness, and the like. Further, the details of drill bit fabrication, end mill fabrication, undercut mill fabrication, and the like, are known in the art, and will not be further described herein, except as may be needed to illustrate the current embodiments.

FIGS. 4A-D illustrate the fabrication of a back-drill hole 440, similar to back-drill hole 140, for a via 422, similar to via 122, in a PCB 400. Back-drill hole 440 is fabricated using bit 300. In a first step, illustrated in FIG. 4A, bit 300 is drilled vertically into PCB 400 in a location that is centered on the axis of via 422. The vertical drilling is performed to the desired depth of back-drill hole 440. In a second step, illustrated in FIG. 4B, bit 300 is moved horizontally leftward to a distance that is less than or equal to the clearance between the edge of milling head 320 and shank region 310. For example, where milling head 320 has a 16 mil diameter and shank region 310 has a 12 mil diameter, the horizontal clearance of milling head 320 will be no greater than 2 mil. This movement of bit 300 forms an undercut region to the leftward side of the base of back-drill hole 440 of up to 2 mil. In a third step, illustrated in FIG. 4C, bit 300 is moved horizontally rightward to a distance that is less than or equal to the clearance between the edge of milling head 320 and shank region 310. For example, this movement of bit 300 may form an undercut region to the rightward side of the base of back-drill hole 440 of up to 2 mil.

Figures 4A, 4B, 4C, 4D:
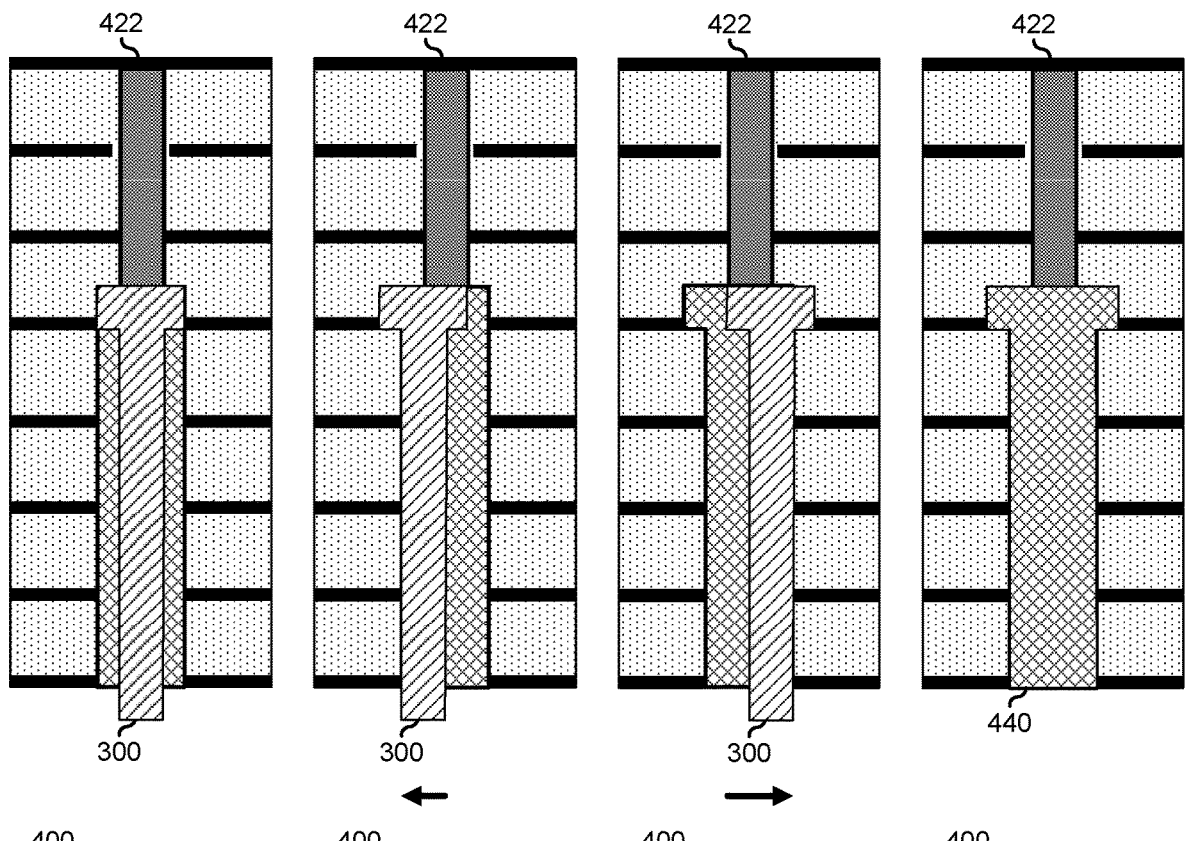
FIGS. 4A-4D illustrate a method of forming a back-drill hole using the undercut back-drill bit of FIG. 3 according to an embodiment of the current disclosure.

In FIG. 4D, the final form of back-drill hole 440 shows a profile with an undercut that is intended to cut any remaining striping from via 422. The movement leftward and rightward of bit 300 may be accompanied by similar movement of the bit inward and outward in PCB 400 to extend the profile to eliminate further striping. More generally, the movement of bit 300 may be provided to form a circular, or near-circular undercut profile at the bottom of back-drill hole 440, as needed or desired. For example, a circular profile may be made where the movement of bit 300 is controlled in a continuous circular motion to create the profile, or a near-circular profile may be created by making eight (8) distinct linear motions of the bit along four non-parallel axis, two sets of mutually perpendicular axis. Other numbers of linear motions by an undercut bit may be utilized as needed or desired to ensure that all of the striping is cut.

Figures 5A, 5B, 5C, 5D:
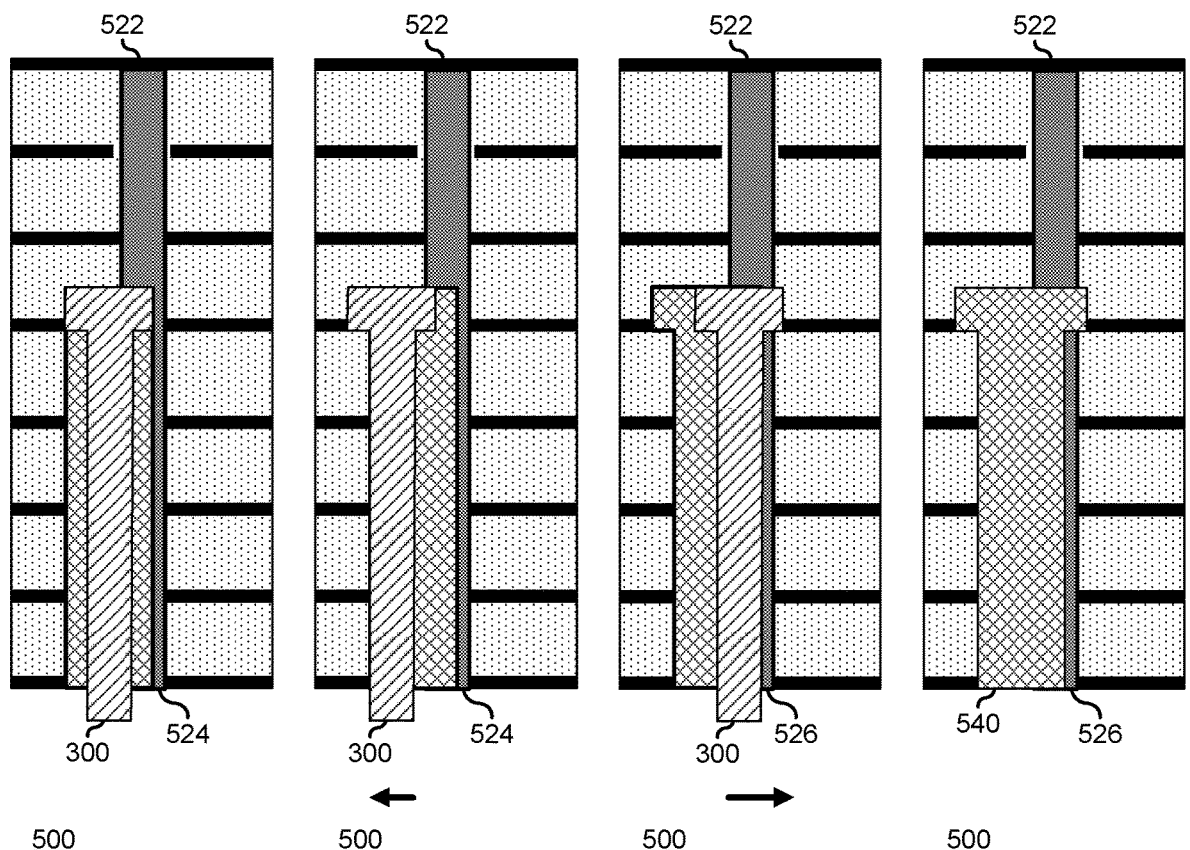
FIGS. 5A-5D illustrate a method of forming a back-drill hole that is misaligned with a via using the undercut back-drill bit of FIG. 3 according to an embodiment of the current disclosure.

FIGS. 5A-D illustrate the fabrication of a back-drill hole 540, similar to back-drill hole 240, for a via 522, similar to via 122, in a PCB 500. Back-drill hole 540 is fabricated using bit 300. In a first step, illustrated in FIG. 5A, bit 300 is drilled vertically into PCB 500 in a location that is mis-aligned from the axis of via 522. The vertical drilling is performed to the desired depth of back-drill hole 540. The misalignment of bit 300 has resulted in the creation of a via stripe 524. In a second step, illustrated in FIG. 5B, bit 300 is moved horizontally leftward to a distance that is less than or equal to the clearance between the edge of milling head 320 and shank region 310. For example, this movement of bit 300 may form an undercut region to the leftward side of the base of back-drill hole 540 of up to 2 mil. In a third step, illustrated in FIG. 5C, bit 300 is moved horizontally rightward to a distance that is less than or equal to the clearance between the edge of milling head 320 and shank region 310. For example, this movement of bit 300 may form an undercut region to the rightward side of the base of back-drill hole 540 of up to 2 mil. In FIG. 5D, the final form of back-drill hole 540 shows a profile with an undercut that is intended to cut any remaining striping from via 522. The movement leftward in the second step may not succeed in cutting any via striping, but the movement rightward succeeds in cutting via stripe 524, forming a via stripe remnant 526 that is not electrically connected to via 522. In this way, the detrimental impact of via stripe 524 on the signal integrity of the high-speed data signal carried on via 522 is eliminated.

The movement leftward and rightward of bit 300 may be accompanied by similar movement of the bit inward and outward in PCB 500 to extend the profile to eliminate further striping. More generally, the movement of bit 300 may be provided to form a circular, or near-circular undercut profile at the bottom of back-drill hole 540, as needed or desired. For example, a circular profile may be made where the movement of bit 300 is controlled in a continuous circular motion to create the profile, or a near-circular profile may be created by making eight (8) distinct linear motions of the bit along four non-parallel axis, two sets of mutually perpendicular axis. Other numbers of linear motions by an undercut bit may be utilized as needed or desired to ensure that all of the striping is cut. However, the movement of bit 300 to form the undercut region may not always succeed in cutting through all of the metalization in via stripe 524. Such undercutting may yet succeed in cutting through a majority of the metalization, thus forming a high-impedance region in via stripe 524 that yet reduces the adverse effects of the via stripe.

In another embodiment, a simplified undercut back-drill bit may be utilized in conjunction with a conventional back-drill bit. In a first process, a conventional back-drill hole may be fabricated in a PCB. The conventional back-drill process will not only form the conventional back-drill hole, but also will remove a majority of the tailings from the conventional back-drill process. Then, in a second undercut process, an undercut bit can be inserted into the back-drill hole and perform an undercut process as described above with reference to FIGS. 4A-D and 5A-D. Because the first process removed the majority of the tailings from the back-drill process, the need for a fluted shaft on the undercut bit is reduced, and so the shank region can have an even smaller diameter, permitting the undercut process to cut deeper to ensure the cutting of all via striping in the back-drill hole. In a particular case, the fabrication of back-drill holes can be accompanied by a striping detection device, as described in U.S. patent application Ser. No. 17/729,886 filed May 3, 2022 (Detecting a Via Striping Issue in a Printed Circuit Board), the disclosure of which is hereby incorporated by reference.

The utilization of the second process of forming the undercut region may be mitigated by the in-situ detection of via striping in the back-drill holes as the first process is performed. Then, when a via striping issue is detected, in a first case, as second drill head with the undercut bit can be instantly utilized to provide an undercut region in the particular back-drill hole, or, in a second case, the presence of the via striping issue can be logged with other detected via striping issues, and then, after the first back-drill hole process is completed, the second undercut process can be performed on all of the back-drill holes with detected via striping issues. The use of the undercut back-drill process as described herein may be utilized for any type of back-drill process, as needed or desired. In particular, a buried via may have undercut back-drill holes from both a top surface of a PCB and from a bottom surface, as needed or desired.

Figure 6:
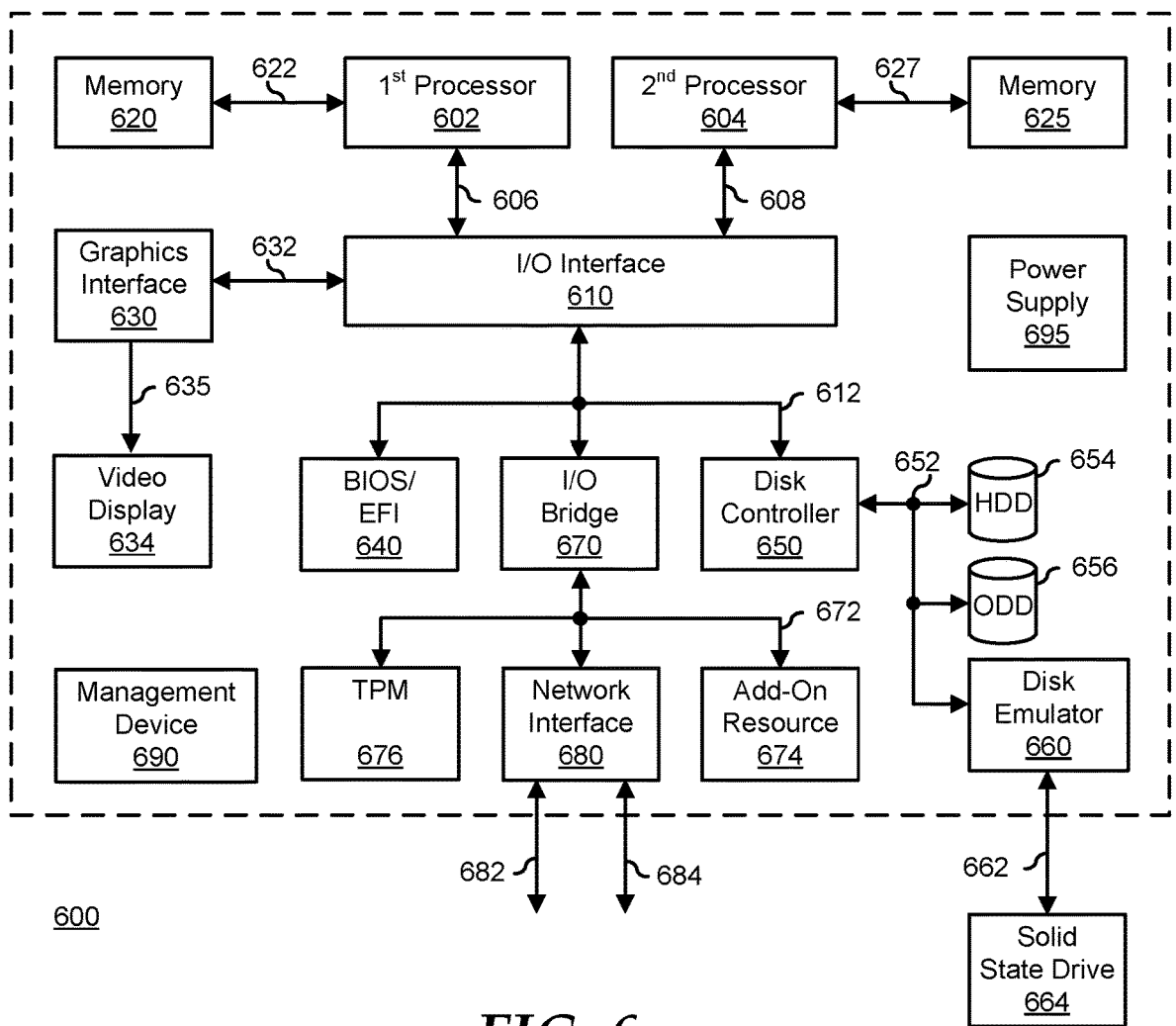
FIG. 6 is a block diagram illustrating a generalized information handling system according to another embodiment of the present disclosure.

FIG. 6 illustrates a generalized embodiment of an information handling system 600. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 600 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 600 can include processing resources for executing machine-executable code, such as a central processing unit (CPU), a programmable logic array (PLA), an embedded device such as a System-on-a-Chip (SoC), or other control logic hardware. Information handling system 600 can also include one or more computer-readable medium for storing machine-executable code, such as software or data. Additional components of information handling system 600 can include one or more storage devices that can store machine-executable code, one or more communications ports for communicating with external devices, and various input and output (I/O) devices, such as a keyboard, a mouse, and a video display. Information handling system 600 can also include one or more buses operable to transmit information between the various hardware components.

Information handling system 600 can include devices or modules that embody one or more of the devices or modules described below, and operates to perform one or more of the methods described below. Information handling system 600 includes processors 602 and 604, an input/output (I/O) interface 610, memories 620 and 625, a graphics interface 630, a basic input and output system/universal extensible firmware interface (BIOS/UEFI) module 640, a disk controller 650, a hard disk drive (HDD) 654, an optical disk drive (ODD) 656, a disk emulator 660 connected to an external solid state drive (SSD) 662, an I/O bridge 670, one or more add-on resources 674, a trusted platform module (TPM) 676, a network interface 680, a management device 690, and a power supply 695. Processors 602 and 604, I/O interface 610, memory 620 and 625, graphics interface 630, BIOS/UEFI module 640, disk controller 650, HDD 654, ODD 656, disk emulator 660, SSD 662, I/O bridge 670, add-on resources 674, TPM 676, and network interface 680 operate together to provide a host environment of information handling system 600 that operates to provide the data processing functionality of the information handling system. The host environment operates to execute machine-executable code, including platform BIOS/UEFI code, device firmware, operating system code, applications, programs, and the like, to perform the data processing tasks associated with information handling system 600.

In the host environment, processor 602 is connected to I/O interface 610 via processor interface 606, and processor 604 is connected to the I/O interface via processor interface 608. Memory 620 is connected to processor 602 via a memory interface 622. Memory 625 is connected to processor 604 via a memory interface 627. Graphics interface 630 is connected to I/O interface 610 via a graphics interface 632, and provides a video display output 635 to a video display 634. In a particular embodiment, information handling system 600 includes separate memories that are dedicated to each of processors 602 and 604 via separate memory interfaces. An example of memories 620 and 625 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 640, disk controller 650, and I/O bridge 670 are connected to I/O interface 610 via an I/O channel 612. An example of I/O channel 612 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 610 can also include one or more other I/O interfaces, including an Industry Standard Architecture (ISA) interface, a Small Computer Serial Interface (SCSI) interface, an Inter-Integrated Circuit (I$^2$C) interface, a System Packet Interface (SPI), a Universal Serial Bus (USB), another interface, or a combination thereof. BIOS/UEFI module 640 includes BIOS/UEFI code operable to detect resources within information handling system 600, to provide drivers for the resources, initialize the resources, and access the resources. BIOS/UEFI module 640 includes code that operates to detect resources within information handling system 600, to provide drivers for the resources, to initialize the resources, and to access the resources.

Disk controller 650 includes a disk interface 652 that connects the disk controller to HDD 654, to ODD 656, and to disk emulator 660. An example of disk interface 652 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 660 permits SSD 664 to be connected to information handling system 600 via an external interface 662. An example of external interface 662 includes a USB interface, an IEEE 1394 (Firewire) interface, a proprietary interface, or a combination thereof. Alternatively, solid-state drive 664 can be disposed within information handling system 600.

I/O bridge 670 includes a peripheral interface 672 that connects the I/O bridge to add-on resource 674, to TPM 676, and to network interface 680. Peripheral interface 672 can be the same type of interface as I/O channel 612, or can be a different type of interface. As such, I/O bridge 670 extends the capacity of I/O channel 612 when peripheral interface 672 and the I/O channel are of the same type, and the I/O bridge translates information from a format suitable to the I/O channel to a format suitable to the peripheral channel 672 when they are of a different type. Add-on resource 674 can include a data storage system, an additional graphics interface, a network interface card (NIC), a sound/video processing card, another add-on resource, or a combination thereof. Add-on resource 674 can be on a main circuit board, on a separate circuit board or add-in card disposed within information handling system 600, a device that is external to the information handling system, or a combination thereof.

Network interface 680 represents a NIC disposed within information handling system 600, on a main circuit board of the information handling system, integrated onto another component such as I/O interface 610, in another suitable location, or a combination thereof. Network interface device 680 includes network channels 682 and 684 that provide interfaces to devices that are external to information handling system 600. In a particular embodiment, network channels 682 and 684 are of a different type than peripheral channel 672 and network interface 680 translates information from a format suitable to the peripheral channel to a format suitable to external devices. An example of network channels 682 and 684 includes InfiniBand channels, Fibre Channel channels, Gigabit Ethernet channels, proprietary channel architectures, or a combination thereof. Network channels 682 and 684 can be connected to external network resources (not illustrated). The network resource can include another information handling system, a data storage system, another network, a grid management system, another suitable resource, or a combination thereof.

Management device 690 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 600. In particular, management device 690 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 600, such as system cooling fans and power supplies. Management device 690 can include a network connection to an external management system, and the management device can communicate with the management system to report status information for information handling system 600, to receive BIOS/UEFI or system firmware updates, or to perform other task for managing and controlling the operation of information handling system 600. Management device 690 can operate off of a separate power plane from the components of the host environment so that the management device receives power to manage information handling system 600 when the information handling system is otherwise shut down. An example of management device 690 includes a commercially available BMC product or other device that operates in accordance with an Intelligent Platform Management Initiative (IPMI) specification, a Web Services Management (WS-Man) interface, a Redfish Application Programming Interface (API), another Distributed Management Task Force (DMTF), or other management standard, and can include an Integrated Dell Remote Access Controller (iDRAC), an Embedded Controller (EC), or the like. Management device 690 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A printed circuit board, comprising:
   a plurality of metal layers;
   a metalized circuit via interconnecting a first one of the metal layers and a second one of the metal layers; and
   a back-drill hole drilled to remove metallization of the metalized circuit via from a third metal layer adjacent to the second metal layer to a fourth metal layer at a first surface of the printed circuit board, wherein the back-drill hole has a profile that includes an undercut directly below the metallized circuit via.

2. The printed circuit board of claim 1, wherein the metallized circuit via has a first diameter.

3. The printed circuit board of claim 2, wherein the back-drill hole has a second diameter greater than the first diameter.

4. The printed circuit board of claim 3, wherein the undercut has a third diameter greater than the second diameter.

5. The printed circuit board of claim 4, wherein the back-drill hole is drilled to a first centerline that is mis-aligned with a second centerline of the back-drill hole.

6. The printed circuit board of claim 5, wherein a first portion of the back-drill hole includes a via stripe, and wherein a second portion of the back-drill hole formed at the undercut cuts the via stripe.

7. The printed circuit board of claim 4, wherein the first diameter is 10 mil, the second diameter is 16 mil, and the third diameter is 20 mil.

8. The printed circuit board of claim 1, wherein the back-drill hole is drilled to a common centerline with the metallized circuit via.

9. A method, comprising:
   forming, in a printed circuit board including a plurality of metal layers, a metalized circuit via interconnecting a first one of the metal layers and a second one of the metal layers; and
   drilling, into the printed circuit board, a back-drill hole to remove metallization of the metalized circuit via from a third metal layer adjacent to the second metal layer to a fourth metal layer at a first surface of the printed circuit board, wherein the back-drill hole has a profile that includes an undercut directly below the metallized circuit via.

10. The method of claim 9, wherein the metallized circuit via has a first diameter.

11. The method of claim 10, wherein the back-drill hole has a second diameter greater than the first diameter.

12. The method of claim 11, wherein the undercut has a third diameter greater than the second diameter.

13. The method of claim 12, wherein the back-drill hole is drilled to a first centerline that is mis-aligned with a second centerline of the back-drill hole.

14. The method of claim 13, wherein a first portion of the back-drill hole includes a via stripe, and wherein a second portion of the back-drill hole formed at the undercut cuts the via stripe.

15. The method of claim 12, wherein the first diameter is 10 mil, the second diameter is 16 mil, and the third diameter is 20 mil.

16. The method of claim 9, wherein the back-drill hole is drilled to a common centerline with the metallized circuit via.

17. A method, comprising:
   forming, in a printed circuit board including a plurality of metal layers, a metalized circuit via interconnecting a first one of the metal layers and a second one of the metal layers;
   drilling, into the printed circuit board, a back-drill hole to remove metallization of the metalized circuit via from a third metal layer adjacent to the second metal layer to a fourth metal layer at a first surface of the printed circuit board, wherein the back-drill hole is drilled with an undercut drill bit; and
   slewing the undercut drill bit in the back-drill hole to form an undercut directly below the metallized circuit via.

18. The method of claim 17, wherein, in slewing the undercut drill bit, the method further comprises cutting a via strip formed when a first centerline of the back-drill hole is mis-aligned with a second centerline of the metallized circuit via.

* * * * *